(12) United States Patent
Song

(10) Patent No.: US 7,301,375 B2
(45) Date of Patent: Nov. 27, 2007

(54) OFF-CHIP DRIVER CIRCUIT AND DATA OUTPUT CIRCUIT USING THE SAME

(75) Inventor: Ho Uk Song, Kyungki-Do (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/736,731

(22) Filed: Dec. 16, 2003

(65) Prior Publication Data

US 2004/0174193 A1    Sep. 9, 2004

(30) Foreign Application Priority Data

Jun. 30, 2003    (KR) ............... 10-2003-0043392

(51) Int. Cl.
*H03K 3/00*    (2006.01)

(52) U.S. Cl. .................. 327/108; 327/109; 327/141; 327/144; 327/153; 327/155; 326/82; 326/83; 326/84

(58) Field of Classification Search ............... 327/153, 327/158, 159, 161, 291, 294, 298, 108, 109, 327/141, 144, 155

See application file for complete search history.

(56) References Cited

U.S. PATENT DOCUMENTS

| | | | | |
|---|---|---|---|---|
| 6,134,691 A | * | 10/2000 | Hirasaka | 714/742 |
| 6,359,483 B1 | * | 3/2002 | Watkins et al. | 327/158 |
| 6,396,318 B2 | * | 5/2002 | Saeki | 327/116 |
| 6,801,062 B2 | * | 10/2004 | Okada | 327/108 |
| 6,822,499 B2 | * | 11/2004 | Ebihara | 327/294 |
| 2002/0036301 A1 | | 3/2002 | Nagaba et al. | 257/200 |

\* cited by examiner

*Primary Examiner*—Tuan T. Lam
*Assistant Examiner*—Hiep Nguyen
(74) *Attorney, Agent, or Firm*—Marshall, Gerstein & Borun LLP

(57) ABSTRACT

An off-chip driver circuit including a plurality of delay circuits, at least two of which have different delay times, in which the delay circuits receive a data signal and generate delayed data signals, respectively. The circuit also includes a plurality of off-chip drivers for respectively receiving the delayed data signals from the respective delay circuits and generating respective output signals in response to respective control signals, wherein the total number of the off-chip drivers to be activated at the same time is changed by the respective control signals which are generated in response to a desired drivability, and the activated off-chip drivers sequentially generate the output signals in response to the delay times, thereby increasing a total drivability of the off-chip driver circuit.

16 Claims, 8 Drawing Sheets

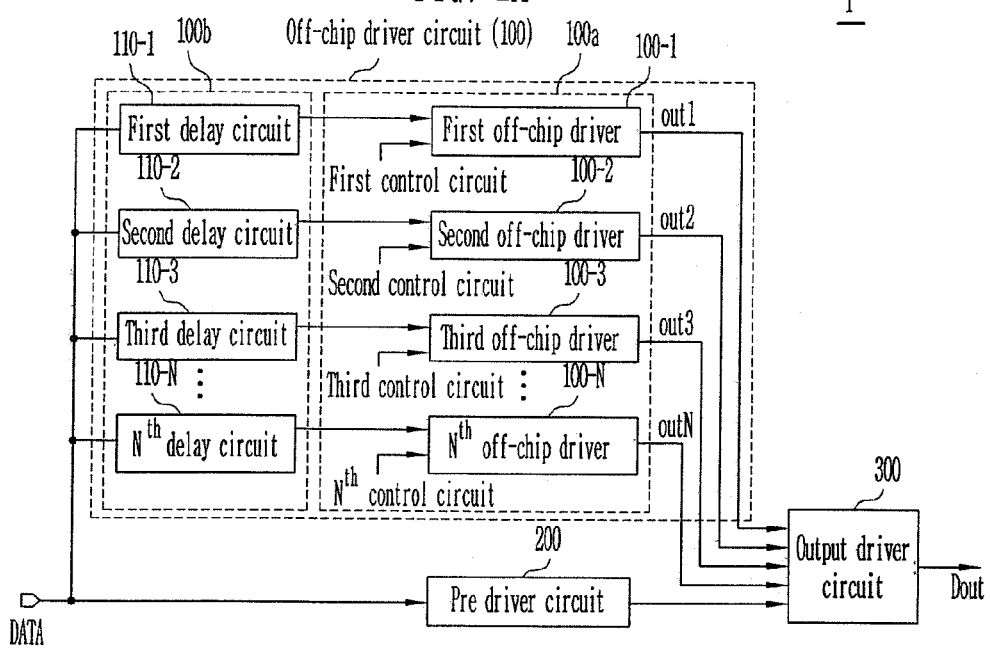
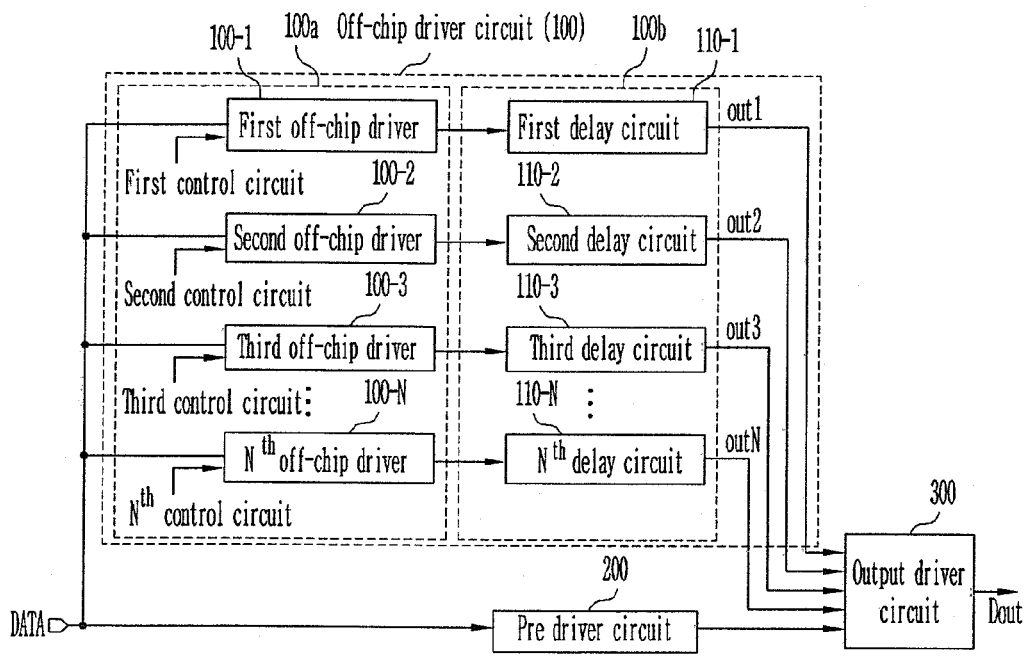

US 7,301,375 B2

OFF-CHIP DRIVER CIRCUIT AND DATA OUTPUT CIRCUIT USING THE SAME

RELATED APPLICATIONS

This application relies for priority upon Korean Patent Application No. 2004-40474 filed Jul. 11, 2002, the contents of which are herein incorporated by reference in their entirety.

BACKGROUND

1. Field of the Invention

The present invention relates to a semiconductor device and, more particularly, to an off-chip driver circuit and an output circuit using the same.

2. Discussion of Related Art

In designing integrated circuits (ICs) such as a memory chip, an off-chip driver circuit is used to transfer data information from the memory chip to external environments. In general, the off-chip driver circuit functions to transfer an internal data signal of a chip to external system environments at possible high speed.

A data output circuit having an off-chip driver circuit according to a prior art will be described with reference to FIG. 1, which shows a block diagram schematically illustrating the configuration of a data output circuit 10 having an off-chip driver circuit in a related art.

The off-chip driver circuit 100 includes off-chip drivers 100-1 to 100-N. Each of the off-chip drivers 100-1 to 100-N uses the same data signal as one input and corresponding first to $N^{th}$ control signals (N is a natural number of 2 or more) as the other input. Each of the off-chip drivers 100-1 to 100-N functions to reflect a possible difference in the performance of a device according to process conditions performed. Furthermore, each of the off-chip drivers is connected correspondingly to output driver within an output driver circuit 300. If a corresponding off-chip driver is turned off, an output driver connected thereto is turned off, and if a corresponding off-chip driver is turned on, an output driver connected thereto is turned on.

If an off-chip driver circuit operates in a high frequency state, however, data signals outputted from the off-chip driver circuit are turned on/off at the same time. It is therefore not technically easy to make an output (Dout) waveform of the output driver circuit 300 having an adequate slew. For example, in products such as a double data rate (DDR), etc. for implementing an ultrahigh speed operation, slew of an output waveform may become great and overshoot may thus take place. This causes the properties of a system interface to be significantly degraded.

SUMMARY OF THE INVENTION

The present invention is directed to provide an output waveform having an adequate slew.

The present invention relates to an off-chip driver circuit that can distribute On/Off time points of an off-chip driver into adequate time intervals.

The present invention is concerned with an off-chip driver circuit and data output circuit using the same, which can enhance the properties of a system interface.

According to one preferred embodiment of the present invention, there is provided an off-chip driver circuit having first to $N^{th}$ off-chip drivers for using a data signal and first to $N^{th}$ control signals respectively to determine whether to produce output signals according to corresponding control signals, being characterized in that at least one of the first to $N^{th}$ off-chip drivers includes a delay circuit(s) for outputting a signal having a given delay time compared with other signals of the remaining off-chip drivers.

Meanwhile, the delay circuit can be added to an input terminal or an output terminal of the off-chip driver. Each of the off-chip drivers may be constructed to perform an NAND operation for a corresponding control signal and the data signal when a logical status of the inputted data signal is High, and an NOR operation for an inverse signal of a corresponding control signal and the data signal when a logical status of the inputted data signal is Low.

Furthermore, each of the off-chip drivers is connected to the corresponding output driver, and if a control signal of a given off-chip driver is at an enable level, an output driver connected to the given off-chip driver is driven.

According to another preferred embodiment of the present invention, there is provided a data output circuit, including an off-chip driver circuit having first to $N^{th}$ off-chip drivers for using a data signal and first to $N^{th}$ control signals respectively to determine whether to produce output signals according to corresponding control signals, a pre-driver circuit for using the data signal to drive an output driver circuit, and the output driver circuit connected to the outputs of the off-chip driver circuit and the pre-driver circuit, wherein at least one of the first to $N^{th}$ off-chip drivers includes a delay circuit(s) for outputting a signal having a given delay time compared with other signals of the remaining off-chip drivers.

In the above, the pre-driver circuit may be constructed to receive the data signal and pulls up or pulls down according to a logical status of the data signal. The output driver circuit includes each of the output drivers corresponding to the off-chip drivers, wherein if a control signal of a given off-chip driver is at an enable level, an output driver connected to the given off-chip driver may be driven.

BRIEF DESCRIPTION OF THE DRAWINGS

FIG. 2 and FIG. 9 are block diagrams schematically illustrating the configuration of a data output circuit having an off-chip driver circuit according to an embodiment of the present invention;

DETAILED DESCRIPTION OF PREFERRED EMBODIMENTS

Figure 1:
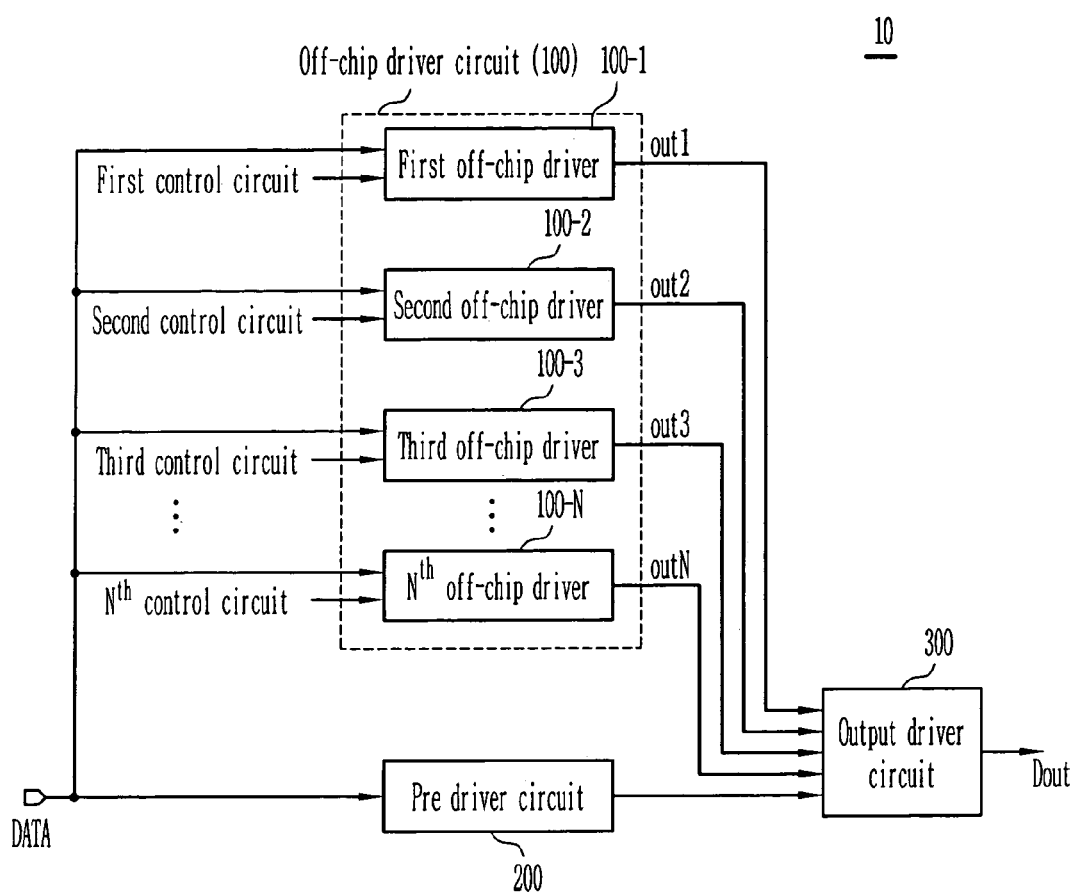
FIG. 1 is a block diagram schematically illustrating the configuration of a data output circuit including an off-chip driver circuit in a related art.

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

FIGS. 2A and 2B are block diagrams schematically illustrating the configuration of a data output circuit including an off-chip driver circuit according to an embodiment of the present invention.

A data output circuit 1 shown in FIG. 2A includes an off-chip driver circuit 100 having first to $N^{th}$ delay circuits 100b; 110-1 to 110-N and first to $N^{th}$ off-chip drivers 100a; 100-1 to 100-N, a pre-driver circuit 200, and an output driver circuit 300 connected to output signals of the off-chip driver circuit 100 and the pre-driver circuit 200. In the above, N is a natural number of 2 or more.

The off-chip driver circuit 100 includes the first to $N^{th}$ off-chip drivers 100-1 to 100-N. Each off-chip driver receives a data signal (DATA) and a corresponding control signal to determine whether to produce an output signal according to the corresponding control signal. The control signal checks a wafer status, after a process is performed, and determines On/Off statuses of each off-chip driver based on the check result. The first to $N^{th}$ control signals are constructed accordingly. For instance, if a single off-chip driver is constructed to have the drivability of 10% and the pre-driver circuit 200 is constructed to have the drivability of 60%, eight off-chip drivers can be constructed to exhibit a total drivability of 60% to 140%, which can be varied in a distance of 10%. For instance, if a single off-chip driver is desired to have a total drivability of 80%, the drivability of 20% is further needed in addition to the 60% drivability of the pre-driver circuit 200. Two of the eight off-chip drivers constituting the off-chip driver circuit 100 are turned on.

Therefore, it is determined whether each of the off-chip drivers 100-1 to 100-N has to be turned on/off by calibrating the off-chip drivers 100-1 to 100-N from an impedance matching viewpoint for a memory chip of a system. It is thus possible to determine the drivability of the output driver circuit 300 driven by the off-chip drivers 100-1 to 100-N. Whether each off-chip driver must be turned on/off can be controlled by a corresponding control signal. A wafer status is checked and whether each off-chip driver must be turned on/off is then determined based on the check result. The first to $N^{th}$ control signals can be constructed accordingly. The first to $N^{th}$ control signals can be inputted from a chip set (now shown).

Furthermore, at least one of the first to $N^{th}$ off-chip drivers 100-1 to 100-N in the off-chip driver circuit 100 has a delay circuit for outputting a signal having a given delay time compared with output signals of the remaining off-chip drivers. For example, if the off-chip driver circuit 100 consists of two off-chip drivers, there is a delay time between two output signals from the off-chip driver.

Figure 9:
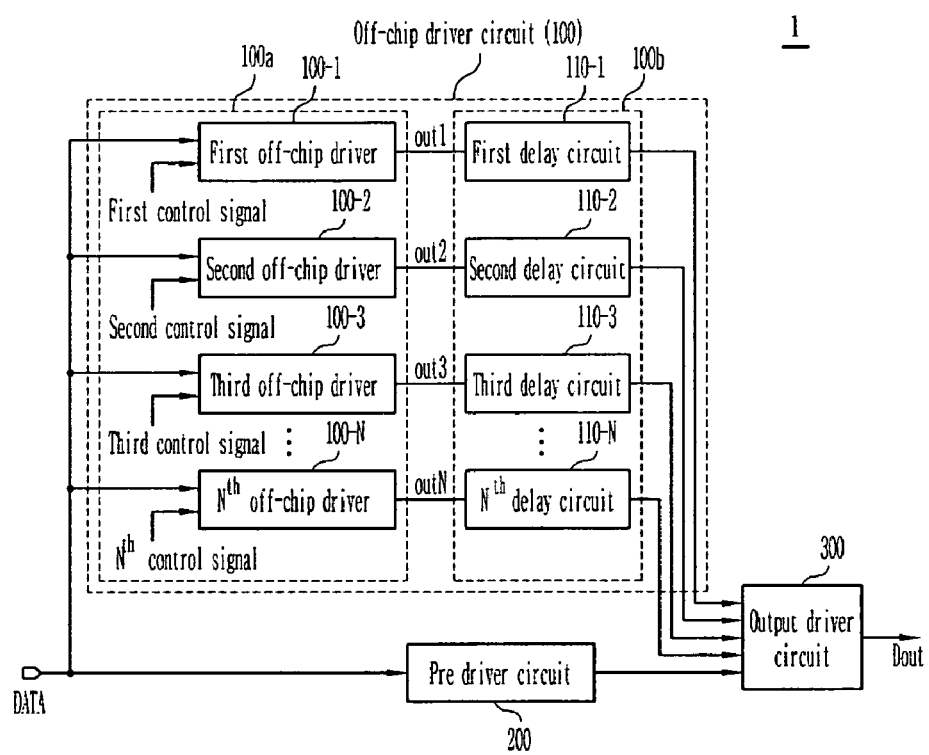

The delay circuit that can be connected to each of the off-chip drivers may be constructed to delay the data signal (DATA) with the delay circuit added to the input terminal of the off-chip driver, or may be constructed to delay the output signal outputted from the off-chip driver with it added to the output terminal of the off-chip driver, as shown in FIG. 9.

The pre-driver circuit 200 uses the data signal (DATA) received thereto to perform a pull up or pull down function depending on a logical status of the data signal. Meanwhile, the pre-driver circuit 200 is connected to a corresponding output driver of the output driver circuit 300 and drives the output driver.

The output driver circuit 300 may have output drivers each corresponding to the off-chip drivers of the off-chip driver circuit 100. If a control signal of a given off-chip driver is at an enable level (for example, a logical High), the output driver circuit 300 drives an output driver connected to the given off-chip driver.

Detailed configurations of the off-chip driver circuit, the pre-driver circuit, and the output driver circuit will now be described.

Figure 3:
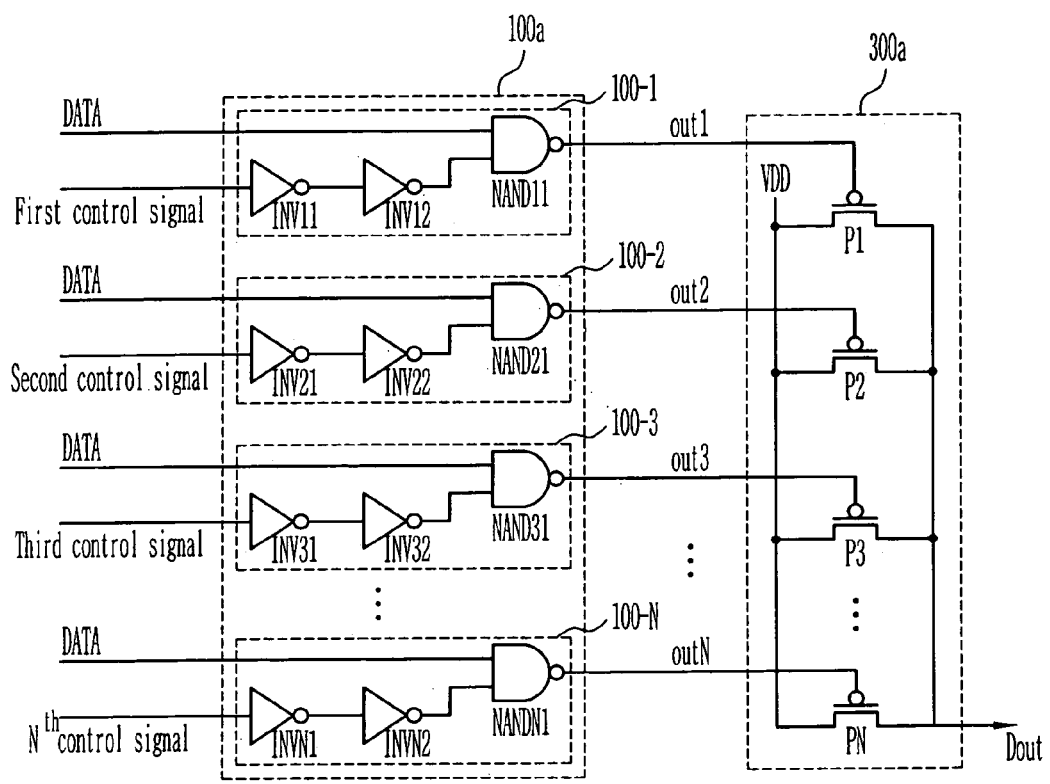
FIG. 3 shows an exemplary configuration of an off-chip driver circuit that operates when a logical High data signal is applied in the data output circuit according to an embodiment of the present invention.
Figure 4:
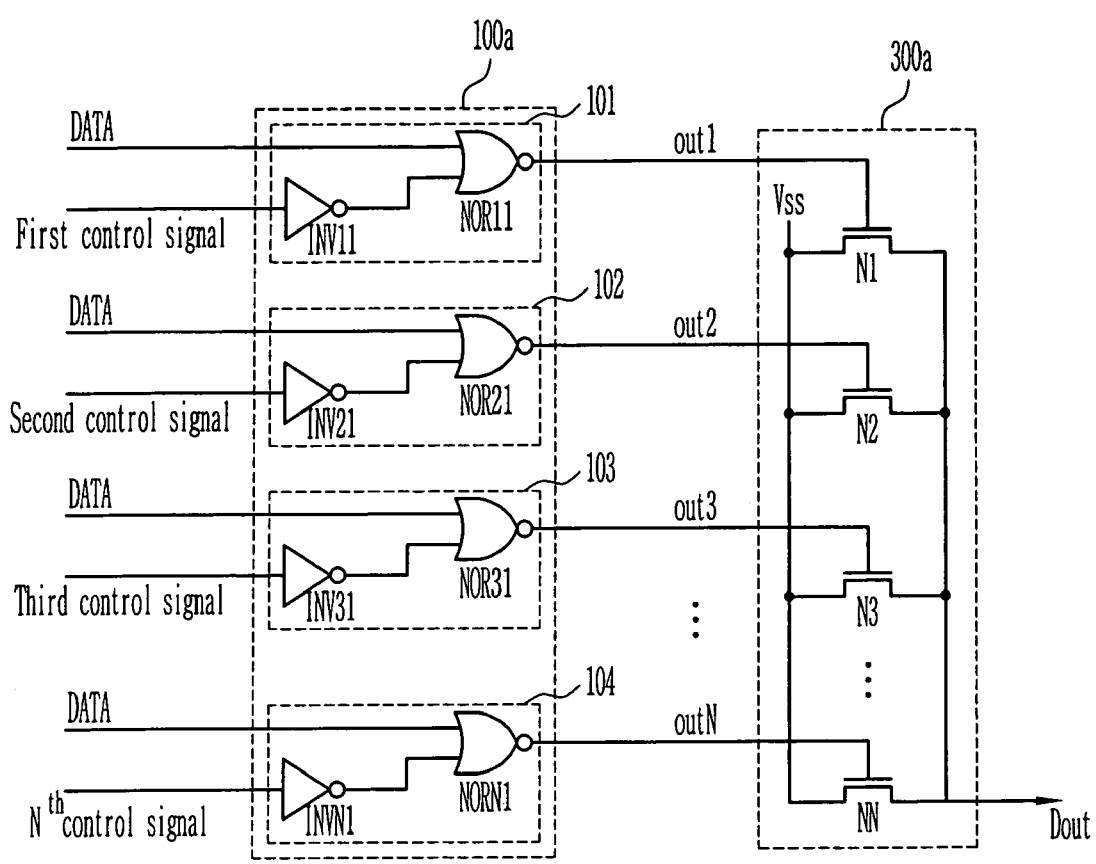
FIG. 4 shows an exemplary configuration of an off-chip driver circuit that operates when a logical Low data signal is applied in the data output circuit according to an embodiment of the present invention.

FIG. 3 shows an exemplary configuration of an off-chip driver circuit that operates when a logical High data signal is applied in the data output circuit according to an embodiment of the present invention, and FIG. 4 shows an exemplary configuration of an off-chip driver circuit that operates when a logical Low data signal is applied in the data output circuit according to an embodiment of the present invention.

Referring to FIG. 3, each of the off-chip drivers 100-1 to 100-N in the off-chip driver circuit 100 includes two inverters INV11 and INV12 to INVN1 and INVN2 for using the control signals (first to $N^{th}$ control signals) to output twice-inverted signals, and NAND devices NAND11 to NANDN1 for using the twice-inverted signals and the data signal (DATA) to perform an NAND operation. For example, in order to turn on a corresponding off-chip driver, a corresponding control signal may be inputted as a logical High. In order to turn off a corresponding off-chip driver, a corresponding control signal may be inputted as a logical Low.

The operation of each of the off-chip drivers 100-1 to 100-N will be described as follows. If the data signal (DATA) is inputted as a logical High, the same logical High is inputted to one terminal of each of the off-chip drivers 100-1 to 100-N. Therefore, if a control signal inputted to the other terminal thereof is inputted as a logical High, a signal outputted from an NAND device becomes a logical Low. If a control signal inputted to the other terminal is inputted as a logical Low, a signal outputted from the NAND device becomes a logical High. These output signals (OUT1 to OUTN) are inputted to the output driver circuit 300. Regarding an output driver circuit 300a, it is to be noted that a portion of the output driver circuit connected to the pre-driver circuit 200 is omitted from the drawing, but only a portion of the output driver circuit 300 connected to the off-chip driver is shown. In case where the output signal is logically Low, a PMOS transistor of the output driver circuit connected thereto is driven.

Delay circuits 110-1 to 110-N are added to respective input terminals of the off-chip drivers 100-1 to 100-N shown in FIG. 3, so that at least two of the input signals (DATA) transferred to the off-chip drivers have different delay times. For example, the delay time may be set to 50 to 300 ps. As another variant, the delay circuits 110-1 to 110-N may be added to the respective output terminals OUT1 to OUTN of the off-chip driver.

Referring to FIG. 4, each of the off-chip drivers 100-1 to 100-N in the off-chip driver circuit 200 includes inverters INV11 to INVN1 for using control signals (first to $N^{th}$ control signals) to output inverted signals, and NOR devices NOR11 to NORN1 for using the inverted signals and the data signals (DATA) to perform an NOR operation. In order to turn on a corresponding off-chip driver, a corresponding control signal may be inputted as a logical High. In order to turn off a corresponding off-chip driver, a corresponding control signal may be inputted as a logical Low.

The operation of each of the off-chip drivers 100-1 to 100-N will be described as follows. If the data signal (DATA) is inputted as a logical Low, the data signal (DATA) of the logical Low is inputted to one terminal of each of the off-chip drivers 100-1 to 100-N. If a control signal inputted to the other terminal thereof is inputted as a logical High, a signal outputted from a corresponding NOR device becomes a logical High. If a control signal inputted to the other terminal thereof is inputted as a logical Low, a signal outputted from the NAND device becomes a logical High. These output signals (OUT1 to OUTN) are inputted to the output driver circuit 300. With respect to the output driver circuit having a reference numeral 300, it is to be noted that a portion of the output driver circuit connected to the pre-driver circuit is omitted, but only a portion of the output driver circuit 300 connected to the off-chip driver is shown. In case where the output signal becomes a logical High, an NMOS transistor of the output driver circuit connected thereto is driven.

In applying the above-mentioned off-chip driver circuit to the actual world, it may be constructed so that the off-chip driver circuit and the output driver circuit shown in FIG. 3 are driven when a data signal of a logical High is applied and so that the off-chip driver circuit and the output driver circuit shown in FIG. 4 are driven when the data signal is logically Low. Furthermore, the above-mentioned off-chip driver circuit may be constructed so that the output signal is delayed only when the data signal of a logical High is applied or the data signal of a logical Low is applied.

Figure 5:
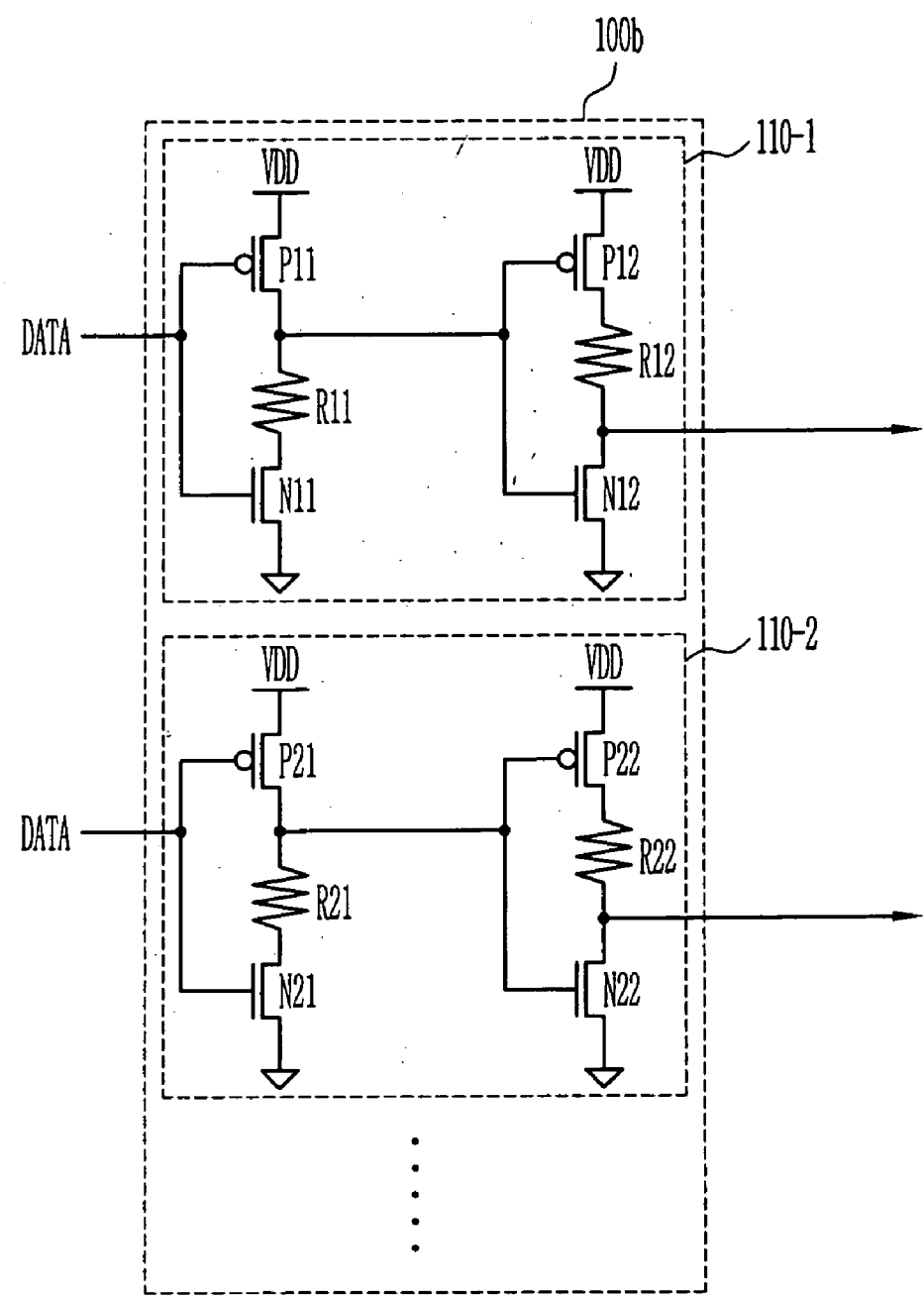
FIG. 5 shows an exemplary configuration of a delay circuit that is applied to the off-chip driver circuit according to an embodiment of the present invention.

FIG. 5 shows an exemplary configuration of the delay circuits. The delay circuits in FIG. 5 may be constructed so that signals outputted via them have different delay times through control of resistors such as R11, R12, R21, R22, etc. Another delay circuit may be constructed by serially connecting two inverters. For example, the number of an inverter serially connected to each off-chip driver has even numbers such as 2, 4, 6, etc. so that each off-chip driver has a different delay time.

Figure 6:
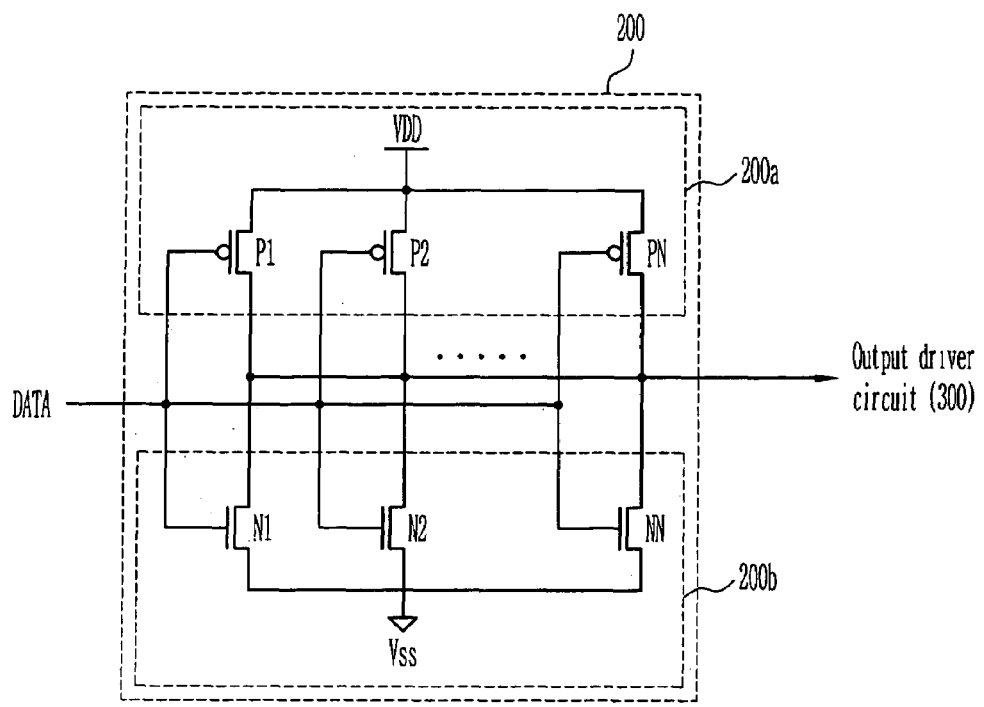
FIG. 6 shows an exemplary configuration of a pre-driver circuit in the data output circuit according to an embodiment of the present invention.

FIG. 6 shows an exemplary configuration of the pre-driver circuit 200 in the data output circuit according to an embodiment of the present invention. The pre-driver circuit 200 has a pull-up unit 200a and a pull-down unit 200b in order to perform a pull-up or pull-down function depending on a logical status. The pull-up unit 200a consists of first to $N^{th}$ PMOS 1P to NP and the pull-down unit 200b consists of first to $N^{th}$ NMOS 1N to NN. Therefore, if the data input signal (DATA) is logically High, the output of the pre-driver circuit 200 becomes a logical Low by the pull-down unit 200b. If the data input signal (DATA) is logically Low, the output of the pre-driver circuit 200 becomes a logical High by the pull-up unit 200a. It is shown in FIG. 6 that the pre-driver circuit 200 has one pre-driver (having one pull-up unit and one pull-down unit). It is, however, should be noted that the pre-driver circuit 200 may be constructed to have two or more pre-drivers. In this case, the size of each of the pre-drivers may be different.

Figure 7:
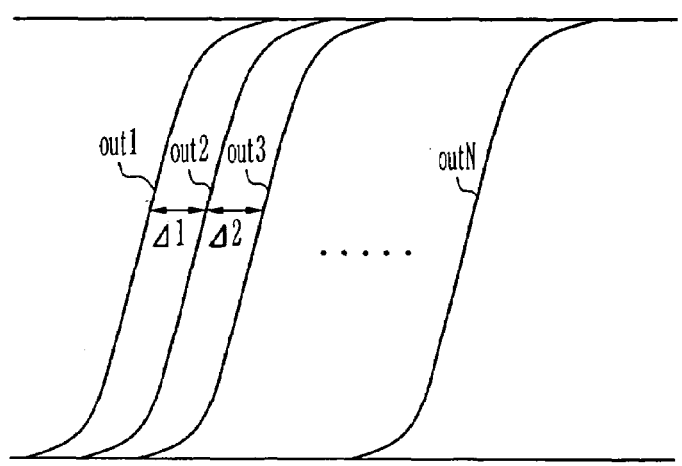
FIG. 7 is a conceptual view for explaining that signals outputted from the off-chip drivers have given delay times according to an embodiment of the present invention.

The operation of the off-chip driver circuit according to an embodiment of the present invention will be described in detail with reference to FIG. 2, FIG. 7 and FIG. 8.

The data signal (DATA) of a logical High or a logical Low is inputted to the off-chip driver circuit 100 and the pre-driver circuit 200. The data signal (DATA) inputted to the pre-driver circuit 200 drives the output driver circuit 300. The data signal (DATA) inputted to the off-chip driver circuit 100 allows the delay circuits added to the respective off-chip drivers to have different delay times. Such a delay time allows the time when a driving device (for example, a MOS device) of the output driver circuit 300 is turned on to have a given time difference. FIG. 7 is a conceptual view for explaining that signals (OUT1 to OUTN) outputted from the off-chip drivers are varied with given delay times (Δ1, Δ2 . . . ).

Figure 8:
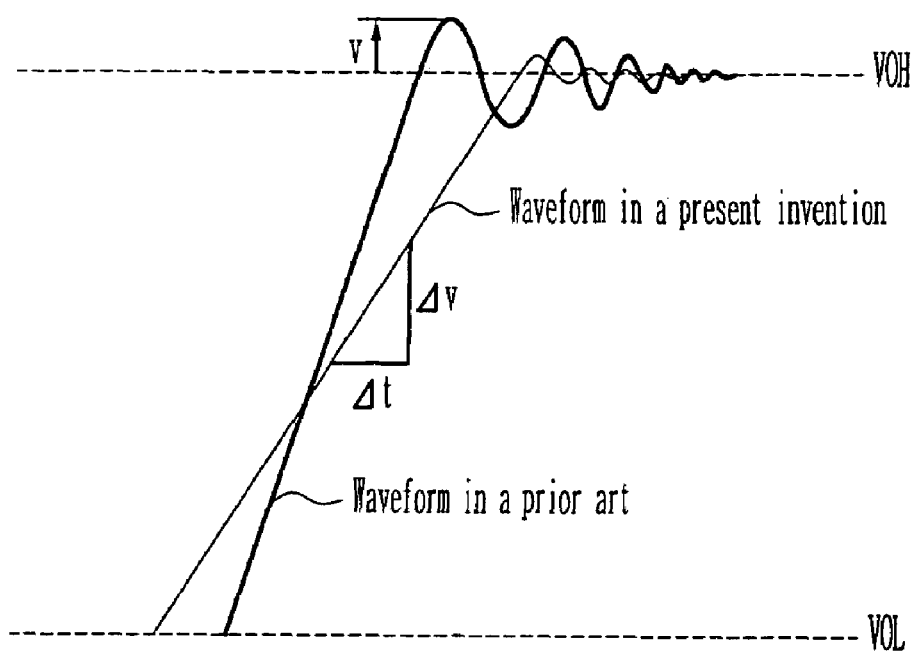
FIG. 8 is a graph showing results of comparing a waveform of a signal outputted from the output driver circuit, where the off-chip driver according to an embodiment of the present invention is applied, with a waveform of a signal in a related art.

FIG. 8 is a graph showing results of comparing a waveform of a signal outputted from the output driver circuit 300 where the off-chip driver according to an embodiment of the present invention is applied, and a waveform of a signal in a related art. As can be seen from FIG. 8, in the output waveform of a related art, overshoot (V) occurs due to excessive slew. On the contrary, in the waveform of the present invention, overshoot rarely happens. Furthermore, in the present invention, the output driver circuit 300 can be controlled so that the output signal has an adequate slew.

According to the present invention described above, a data output circuit can be constructed so that an output signal has an adequate slew. In particular, in products such as a semiconductor memory for implementing an ultrahigh speed operation, i.e., DDR, etc., slew of an output waveform can be controlled. Therefore, the present invention has an effect that it can enhance properties of a system interface.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. An off-chip driver circuit, comprising;
   a plurality of delay circuits, at least two of which have different delay times, in which the delay circuits receive a data signal and generate delayed data signals, respectively; and
   a plurality of off-chip drivers for respectively receiving the delayed data signals from the respective delay circuits and generating respective output signals in response to respective control signals,
   wherein each off-chip driver comprises a first inverter for inverting the control signal, a second inverter for inverting an output of the first inverter and a NAND gate for outputting the output signal in response to the delayed data signal and an output of the second inverter.

2. The off-chip driver circuit as claimed in claim 1, wherein the off-chip driver comprises:
   an inverter for inverting the control signal; and
   an NOR gate for outputting the output signal in response to the delayed data signal and an output of the inverter.

3. A circuit for outputting output signals, comprising;
   a plurality of off-chip drivers for generating a plurality of output signals, respectively, in response to respective control signals; and
   a plurality of delay circuits at least two of which have different delay times with respect to each other, in which the delay circuits respectively receive the output signals and generate delayed output signals, respectively,
   wherein each off-chip driver comprises a first inverter for inverting the control signal, a second inverter for inverting an output of the first inverter and a NAND gate for outputting the output signal in response to the delayed data signal and an output of the second inverter.

4. The off-chip driver circuit as claimed in claim 3, wherein the off-chip driver comprises:
 an inverter for inverting the control signal; and
 an NOR gate for outputting the output signal in response to the data signal and an output of the inverter.

5. A data output circuit, comprising:
 a plurality of delay circuits, at least two of which have different delay times with respect to each other, in which the delay circuits receive a data signal and generate delayed data signals, respectively;
 a plurality of off-chip drivers for respectively receiving the delayed data signals from the respective delay circuits and generating respective output signals in response to respective control signals;
 a pre-driver circuit adapted to receive the data signal and drive an output driver circuit; and
 the output driver circuit connected to the output terminals of the off-chip drivers and the pre-driver circuit,
 wherein the total number of the off-chip drivers to be activated is determined by the respective control signals which are generated in response to a desired drivability, and the activated off-chip drivers generate the output signals having the different delay times in response to the delayed data signals, thereby increasing a total drivability of the off-chip drivers.

6. The data output circuit as claimed in claim 5, wherein the pre-driver circuit receives the data signal and performs a pull-up or a pull-down function according to a logical status of the data signal.

7. The data output circuit as claimed in claim 5, wherein the off-chip driver comprises:
 a first inverter for inverting the control signal;
 a second inverter for inverting an output of the first inverter; and
 an NAND gate for outputting the output signal in response to the delayed data signal and an output of the second inverter.

8. The data output circuit as claimed in claim 5, wherein the output driver circuit comprises output drivers connected to output terminals of the respective off-chip drivers and the pre driver circuit, wherein when the control signal of a given off-chip driver is at an enable level, an output driver connected to the given off-chip driver is driven.

9. The data output circuit as claimed in claim 5, wherein the total drivability of the off-chip drivers is 80% of a target drivability and a drivability of the pre driver circuit is 60% of the target drivability so that a drivability of the data output circuit varies from 60% of the target drivability to 140% of the target drivability.

10. The off-chip driver circuit as claimed in claim 5, wherein the off-chip driver comprises:
 an inverter for inverting the control signal; and
 an NOR gate for outputting the output signal in response to the delayed data signal and an output of the inverter.

11. A data output circuit, comprising:
 a plurality of off-chip drivers for respectively receiving a data signal and generating a plurality of output signals, respectively, in response to respective control signals;
 a plurality of delay circuits at least two of which have different delay times, in which the delay circuits respectively receive the output signals and generate delayed output signals, respectively;
 a pre-driver circuit receiving the data signal and driving an output driver circuit; and
 the output driver circuit connected to the output terminals of the delay circuits and the pre-driver circuit,
 wherein the total number of the off-chip drivers to be activated is determined by the respective control signals which are generated in response to a desired drivability, and the delay circuits generate the delayed output signals in response to the delay times, thereby increasing a total drivability of the off-chip drivers.

12. The data output circuit as claimed in claim 11, wherein the pre-driver circuit receives the data signal and performs a pull-up or a pull-down function according to the logical status of the data signal.

13. The data output circuit as claimed in claim 11, wherein the off-chip driver comprises:
 a first inverter for inverting the control signal;
 a second inverter for inverting an output of the first inverter; and
 an NAND gate for outputting the output signal in response to the data signal and an output of the second inverter.

14. The data output circuit as claimed in claim 11, wherein the output driver circuit comprises output drivers connected to output terminals of the delay circuits and the pre driver circuit respectively, wherein when the control signal of a given off-chip driver is at an enable level, the output driver connected to the given off-chip driver is driven.

15. The data output circuit as claimed in claim 11, wherein the total drivability of the off-chip drivers is 80% of a target drivability and a drivability of the pre driver circuit is 60% of the target drivability so that a drivability of the data output circuit varies from 60% of the target drivability to 140% of the target drivability.

16. The off-chip driver circuit as claimed in claim 11, wherein the off-chip driver comprises:
 an inverter for inverting the control signal; and
 an NOR gate for outputting the output signal in response to the data signal and an output of the inverter.

* * * * *